(12) United States Patent
Chou et al.

(10) Patent No.: US 10,149,405 B2
(45) Date of Patent: Dec. 4, 2018

(54) ELECTRONIC DEVICE

(71) Applicant: ASUSTeK COMPUTER INC., Taipei (TW)

(72) Inventors: Yu-Chun Chou, Taipei (TW); San-Feng Lin, Taipei (TW); Yuan-An Hsu, Taipei (TW); Shih-Wen Chiang, Taipei (TW); Cheng-An Ho, Taipei (TW); Zheng-Cheng Lin, Taipei (TW); Yi-Wei Hsu, Taipei (TW)

(73) Assignee: ASUSTEK COMPUTER INC., Taipei (TW)

( * ) Notice: Subject to any disclaimer, the term of this patent is extended or adjusted under 35 U.S.C. 154(b) by 0 days.

(21) Appl. No.: 15/795,474

(22) Filed: Oct. 27, 2017

(65) Prior Publication Data

US 2018/0132378 A1 May 10, 2018

(30) Foreign Application Priority Data

Nov. 10, 2016 (CN) .......................... 2016 1 0994269

(51) Int. Cl.
| | |
|---|---|
| *H05K 7/20* | (2006.01) |
| *G06F 1/20* | (2006.01) |
| *H05K 5/02* | (2006.01) |
| *G06F 1/16* | (2006.01) |
| *G01D 5/56* | (2006.01) |
| *G01D 5/58* | (2006.01) |

(52) U.S. Cl.
CPC ......... *H05K 7/20127* (2013.01); *G06F 1/166* (2013.01); *G06F 1/203* (2013.01); *H05K 5/0213* (2013.01); *G01D 5/56* (2013.01); *G01D 5/58* (2013.01)

(58) Field of Classification Search
CPC combination set(s) only.
See application file for complete search history.

(56) References Cited

U.S. PATENT DOCUMENTS

| | | |
|---|---|---|
| 2013/0027873 A1 | 1/2013 | Chen et al. |
| 2013/0027877 A1 | 1/2013 | Yang et al. |

FOREIGN PATENT DOCUMENTS

| | | |
|---|---|---|
| CN | 202838165 U | 3/2013 |
| CN | 204740551 U | 11/2015 |
| TW | 201306714 A1 | 2/2013 |

*Primary Examiner* — Lisa Lea Edmonds
(74) *Attorney, Agent, or Firm* — McClure, Qualey & Rodack, LLP

(57) ABSTRACT

An electronic device, comprises: a base including a top surface and a bottom surface; a baseplate, a side edge of the baseplate is pivotally connected with the bottom surface, a moving member disposed in the base and configured to push against the baseplate; a linkage member disposed in the base and configured to push against the moving member; and a push member disposed in the base, the push member makes the baseplate moved via the linkage member and the moving member in sequence to make the baseplate selectively cover the bottom surface or detached from the bottom surface.

12 Claims, 8 Drawing Sheets

ELECTRONIC DEVICE

CROSS-REFERENCE TO RELATED APPLICATION

This application claims the priority benefit of CN application serial No. 201610994269.5, filed on Nov. 10, 2016. The entirety of the above-mentioned patent application is hereby incorporated by references herein and made a part of specification.

BACKGROUND OF THE INVENTION

Field of the Invention

The disclosure relates to an electronic device and, more particularly, relates to an electronic device with a changeable housing structure.

Description of the Related Art

With technology progress, electronic devices (such as notebooks) tend to be light, small, thin, but have high performance. Thus, heat dissipation demand is also increased. Heat generated from components of the electronic device increasing. However, a small size of the electronic device causes the heat dissipation efficiency is decrease.

BRIEF SUMMARY OF THE INVENTION

According to an aspect of the disclosure, an electronic device is provided. An electronic device, comprises: a base including a top surface and a bottom surface; a baseplate, a side edge of the baseplate is pivotally connected with the bottom surface, a moving member disposed in the base and configured to push against the baseplate; a linkage member disposed in the base and configured to push against the moving member; and a push member disposed in the base, the push member makes the baseplate moved via the linkage member and the moving member in sequence to make the baseplate selectively cover the bottom surface or detached from the bottom surface.

With the configuration in embodiments, the baseplate moves far away from the top surface of the base to make the baseplate not pivotally connected with the side edge to form an opening. Thus, heat convection between heat components of the electronic device and external air is improved.

BRIEF DESCRIPTION OF THE DRAWINGS

These and other features, aspects and advantages of the disclosure will become better understood with regard to the following embodiments and accompanying drawings.

DETAILED DESCRIPTION OF THE EMBODIMENTS

Figure 1:
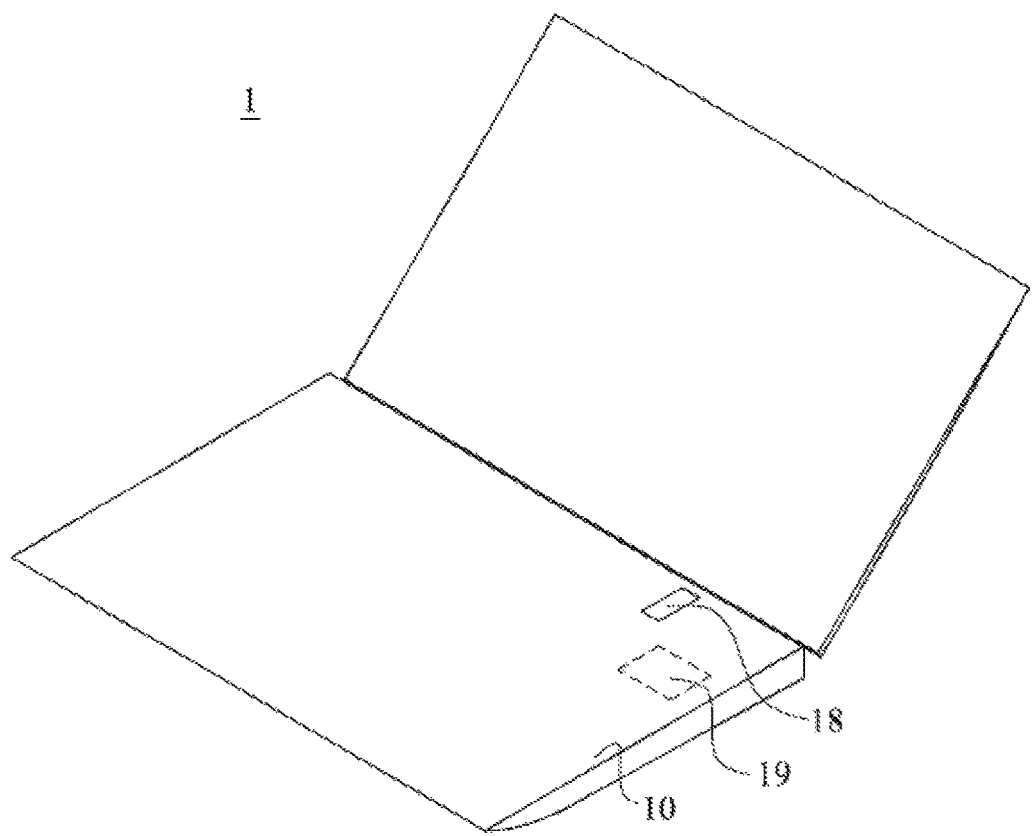
FIG. 1 is a schematic diagram showing an electronic device in an embodiment.
Figure 2:
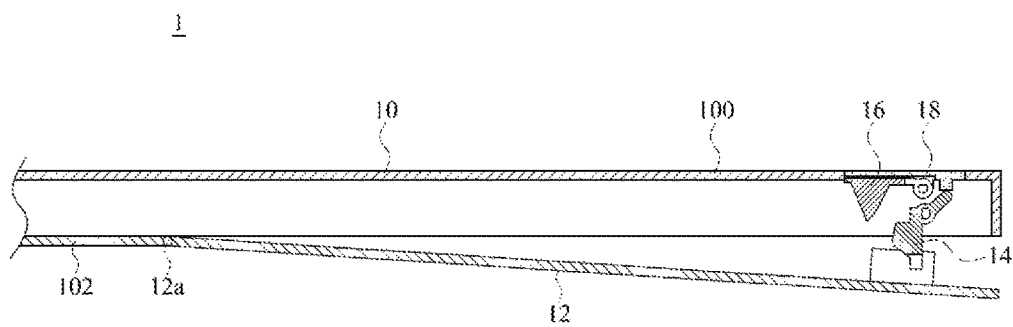
FIG. 2 is a section view of an electronic device in an embodiment.

FIG. 1 is a schematic diagram showing an electronic device in an embodiment. FIG. 2 is a section view of an electronic device in an embodiment. As shown in FIG. 1 and FIG. 2. The electronic device 1 includes a base 10, a baseplate 12, a moving member 14, a linkage member 16, and a push member 18. The base 10 includes a top surface 100 and a bottom surface 102. A side edge 12a of the baseplate 12 is pivotally connected with the bottom surface 102 of the base 10. Structures, functions, and connections of components are illustrated in detail hereinafter.

Figure 3:
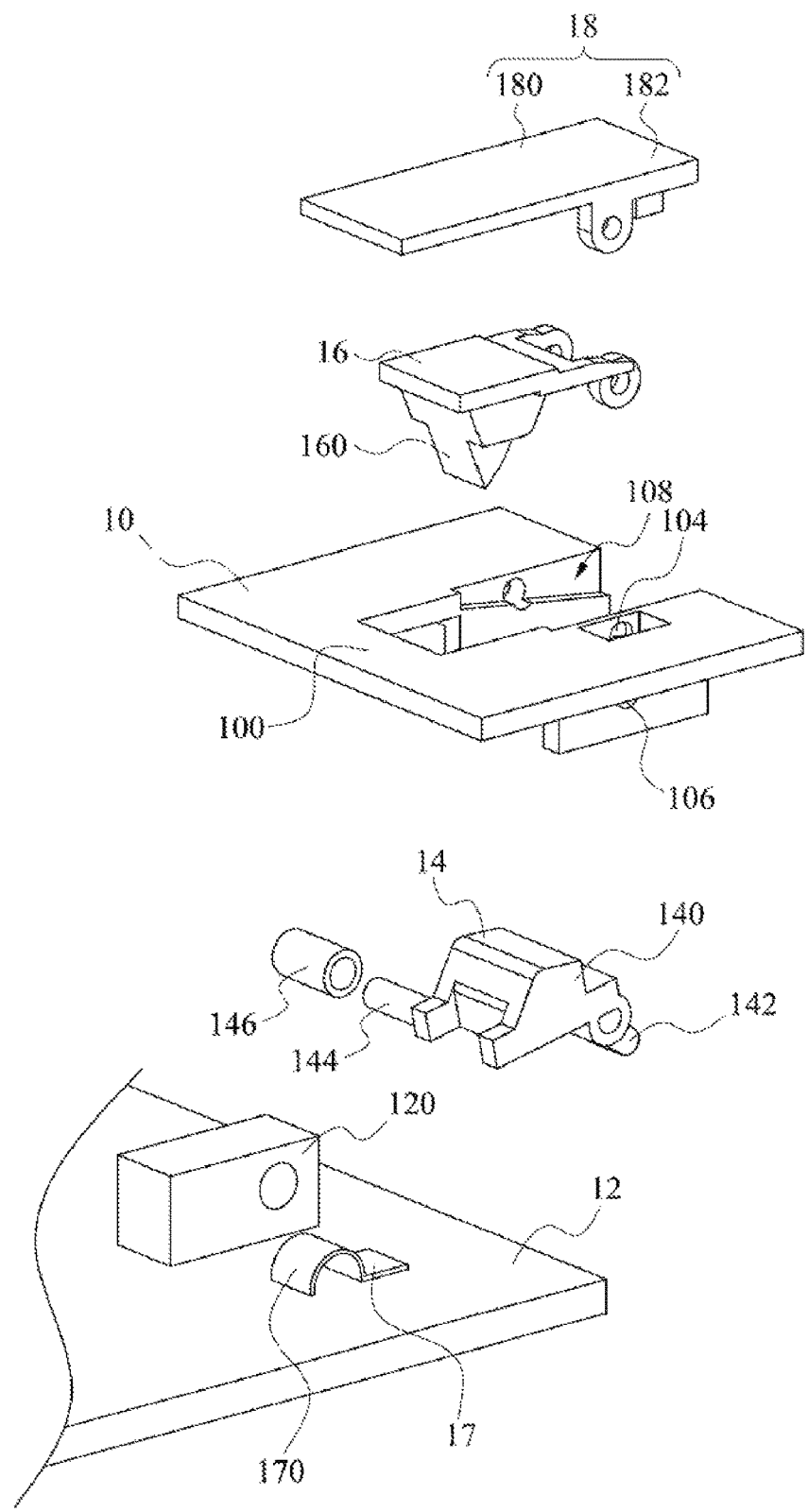
FIG. 3 is an exploded view of an electronic device in an embodiment.

FIG. 3 is an exploded view of an electronic device in an embodiment. In the embodiment, the base 10 includes a first pivot portion 104 and a second pivot portion 106. The first pivot portion 104 is adjacent to a top surface 100 of the base 10. The second pivot portion 106 is adjacent to a bottom surface 102. The first pivot portion 104 of the base 10 is pivotally connected with the push member 18 and the linkage member 16. The second pivot portion 106 is pivotally connected with the moving member 14. The push member 18 is configured inside the base 10. At least part of the push member 18 is exposed out of an opening 108 from the top surface 100 of the base 10. The push member 18 is operable from the out of the base 10 of the electronic device 1. The push member 18 includes a first push portion 180 and a second push portion 182 opposite to each other. The first push portion 180 or the second push portion 182 of the push member 18 is selectively pushed to make the first push portion 180 or the second push portion 182 move towards the inside of the base 10 around the center of the first pivot portion 104.

The linkage member 16 is configured inside the base 10 and below the push member 18. The linkage member 16 includes a first protrusion 160. The first protrusion 160 corresponds to the first push portion 180 of the push member 18. When the first push portion 180 of the push member 18 rotates towards the linkage member 16, the first protrusion 160 of the linkage member 16 is pushed by the first push portion 180 of the push member 18. Then, the linkage member 16 moves towards the moving member 14 around the first pivot portion 104 of the base 10 as a center.

The moving member 14 is configured in the base 10 and below the linkage member 16. The moving member 14 includes a press portion 140 and a second protrusion 142. The press portion 140 corresponds to the first protrusion 160 of the linkage member 16. The second protrusion 142 corresponds to the second push portion 182 of the push member 18. When the first protrusion 160 of the linkage member 16 rotates towards the moving member 14, the press portion 140 of the moving member 14 is pushed by the first protrusion 160. Then, the press portion 140 rotates away from the top surface 100 of the base 10 around the second pivot portion 106 as a center. When the second push portion 182 of the push member 18 rotates towards the moving member 14, the second protrusion 142 of the moving member 14 is pushed by the second push portion 182. Then, the second protrusion 142 of the moving member 14 rotates away the top surface 100 of the base 10 with the second pivot portion 106 as a center. That is, the moving member 14 rotates forwardly or reversely when different part (the press portion 140 or the second protrusion 142) is pressed.

In the embodiment, the press portion 140 of the moving member 14 includes a pivot 144. The baseplate 12 includes a third pivot portion 120. The third pivot portion 120 of the baseplate 12 is pivotally connected with the pivot 144 of the moving member 14. In the embodiment, the press portion 140 further includes a bearing 146. The bearing 146 is configured between the pivot 144 and the third pivot portion 120 to reduce the friction between the pivot 144 and the third pivot portion 120 when the pivot 144 rotates.

FIG. 4A to FIG. 4E is a section view of part of an electronic device in an embodiment.

Figure 4A:
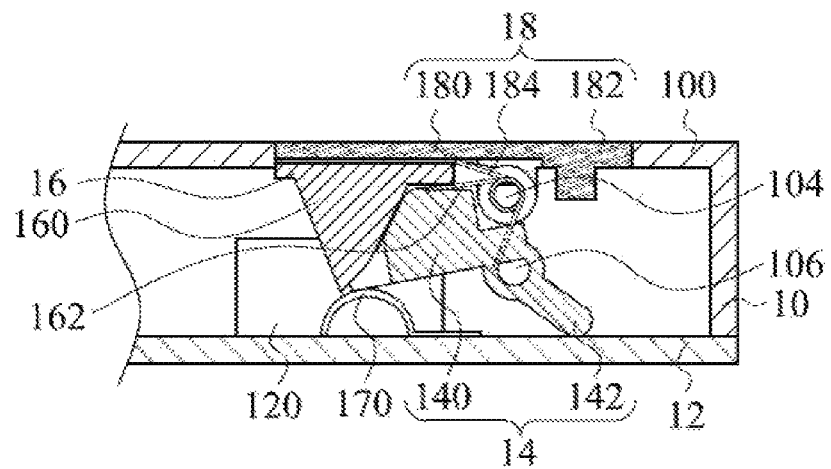
FIG. 4A to FIG. 4E is a section view of part of an electronic device in an embodiment.
Figure 4B:
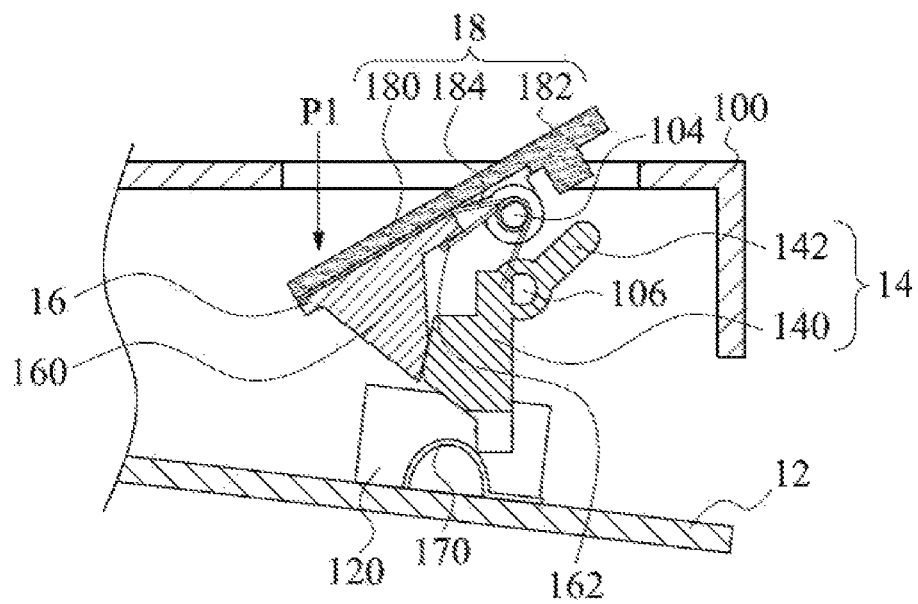

In FIG. 4A and FIG. 4B, when a push P1 is applied at the first push portion 180 of the push member 18, the first push portion 180 pushes the linkage member 16 to make the first protrusion 160 of the linkage member 16 rotates towards the moving member 14. When the first protrusion 160 pushes against the press portion 140 of the moving member 14, the press portion 140 of the moving member 14 rotates relative the second pivot portion 106 towards a direction away from the top surface 100 of the base 10. As a result, the baseplate 12 which is pivotally connected with the press portion 140 moves away from the top surface 100 of the base 10 and the bottom surface 102. The side edge 12a of the baseplate 12 is pivotally connected with the bottom surface 102 of the base 10 (as shown in FIG. 2). The opposite side edge is not connected with the bottom surface 102 of the base 10. With the configuration, the baseplate 12 moves away from the top surface 100 of the base 10. Then, an opening is formed at a side of the baseplate 12 which is not pivotally connected with the side edge 12a. Then, heat convection between heat components inside the electronic device 1 with external air is improved to enhance the heat dissipation effect of the electronic device 1.

In an embodiment, the electronic device 1 further includes a block member 17 (as shown in FIG. 3). The block member 17 is disposed on the baseplate 12 and below the moving member 14. The block member 17 includes a third protrusion 170. The block member 17 is below the moving member 14. When the press portion 140 of the moving member 14 rotates away from the top surface 100 of the base 10, the press portion 140 presses a side of the third protrusion 170 of the block member 17. Consequently, the third protrusion 170 is pressed by the press portion 140 to reduce the height of the third protrusion 170. Then, the press portion 140 overcomes the interference of the third protrusion 170. The press portion 140 rotates to the other side of the third protrusion 170, as shown in FIG. 4B. Then, the third protrusion 170 recovers the shape to block the press portion 140. As a result, the moving member 14 rotates backwardly. It avoids that the moving member 14 rotates opposite to the press direction. The distance between the press portion 140 and the top surface 100, and the distance between the press portion 140 and the bottom surface 102 are kept. As a result, the distance between the baseplate 12 and the top surface 100 of the base 10, and the distance between the baseplate 12 and the bottom surface 102 are kept.

Figure 4C:
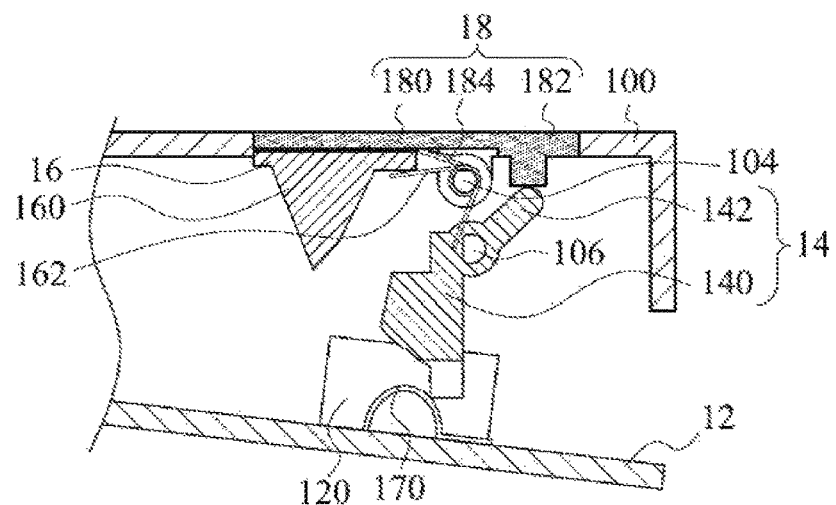

As shown in FIG. 4C, in an embodiment, the reset member 162 is configured between the push member 18, the linkage member 16 and the first pivot portion 104 of the base 10. In an embodiment, the reset member 162 is a torsional spring. When the push P1 is released from the push member 18, as shown in FIG. 4B, the first push portion 180 of the push member 18 and the first protrusion 160 of the linkage member 16 go back to the original position via the elastic force the reset member 162. In an embodiment, after the first push portion 180 of the push member 18 is repositioned, the outer surface of the push member 18 is aligned with the top surface 100 of the base 10.

Figure 4D:
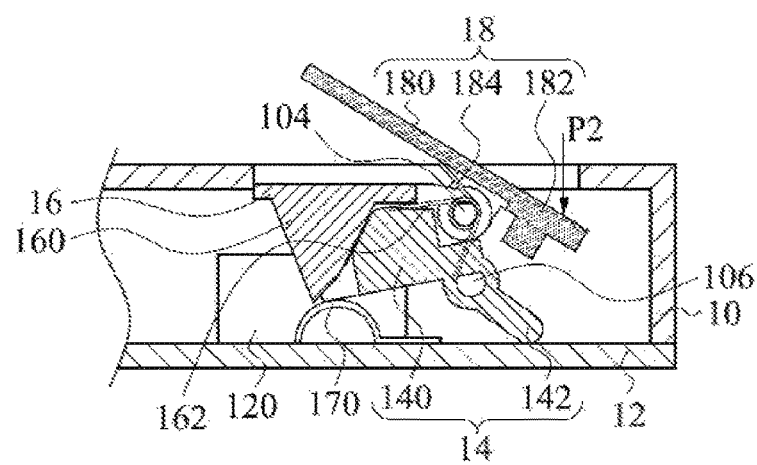

As shown in FIG. 4D, when the push P2 is applied at the second push portion 182 of the push member 18, the second push portion 182 pushes the second protrusion 142 of the moving member 14. The second protrusion 142 rotates around the second pivot portion 106 to move away from the top surface 100 of the base 10. The press portion 140 of the moving member 14 rotates towards the top surface 100 of the base 10. During the rotate of the moving member 14, the press portion 140 of the moving member 14 presses the third protrusion 170 of the block member 17. Since the third protrusion 170 is pressed by the press portion 140, the height of the third protrusion 170 is reduced. Then, the press portion 140 overcomes the interference of the third protrusion 170 to release the block on the press portion 140 due to the third protrusion 170. During the process of the press portion 140 moves towards the top surface 100 of the base 10, the baseplate 12 pivotally connected with the press portion 140 is driven to move towards the top surface 100 of the base 10 and the bottom surface 102. When the second push portion 182 of the push member 18 is pushed, the baseplate 12 moves towards the top surface 100 of the base 10. Then, the baseplate 12 moves to close the opening that is formed when the baseplate 12 is not pivotally connected with the side edge 12a.

Figure 4E:
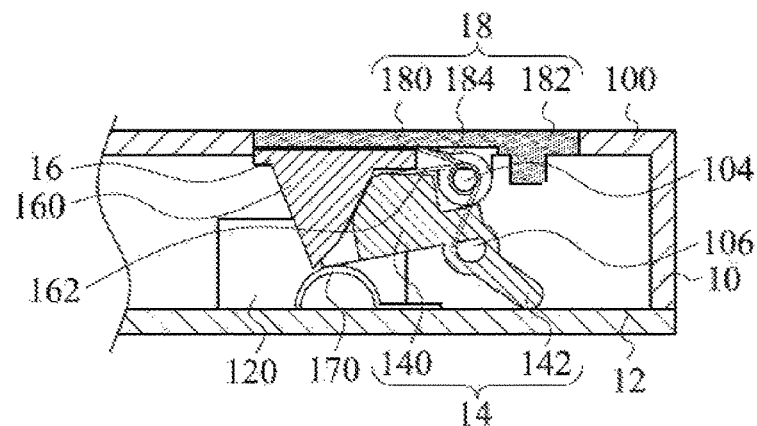

As shown in FIG. 4E, a reset member 184 is configured among the push member 18, the linkage member 16 and the first pivot portion 104. When the push P2 is released from the push member 18, the second push portion 182 of the push member 18 rotates back to the original position via the reset member 184.

Figure 5:
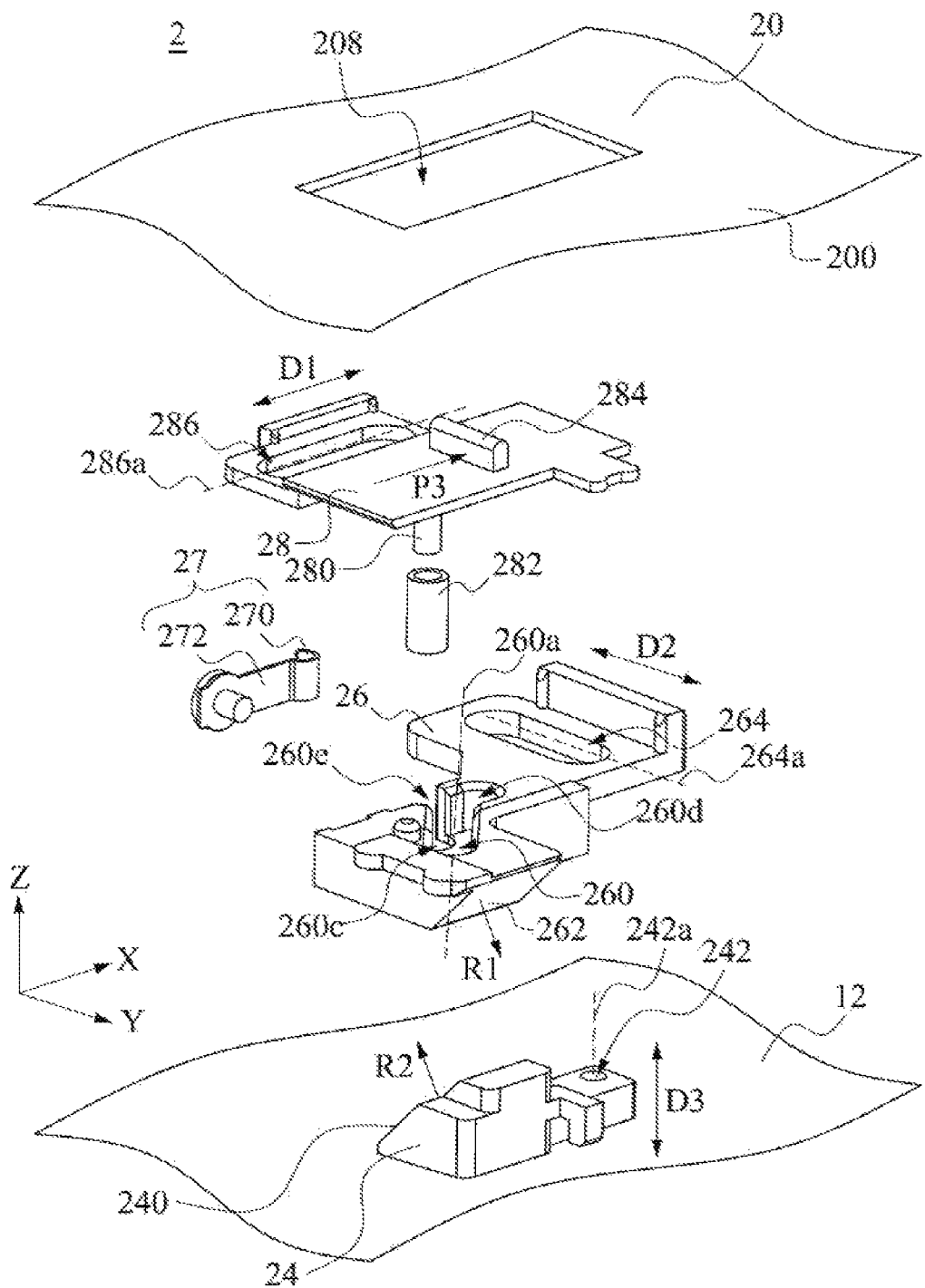
FIG. 5 is an exploded view of an electronic device in an embodiment.

FIG. 5 is an exploded view of an electronic device in an embodiment. The electronic device 2 is similar to the electronic device 1. The same or similar numbers denote the same or similar components. The difference between the electronic device 2 and the electronic device 1 is illustrated hereinafter.

As shown in FIG. 5, in the embodiment, the electronic device 2 includes a base 20, a baseplate 12, a moving member 24, a linkage member 26, and a push member 28. The push member 28 is movably configured inside the base 20. The push member 28 includes a sliding member 280 and a third push portion 284. The sliding member 280 protrudes towards the linkage member 26. The third push portion 284 protrudes away from the inner of the base 20. At least part (such as the third push portion 284) of the push member 28 protrudes out from the opening 208 of the top surface 200 of the base 20. The third push portion 284 is pushed along the first direction D1 from the out of the base 20 to operate the push member 28.

In the embodiment, the push member 28 is configured to move along the first direction D1 relative to the base 10. For example, the push member 28 includes a first limiting hole 286. The base 20 includes a corresponding position limiting member. The first limiting hole 286 includes a first central axis 286a which is parallel to the max aperture direction. The first central axis 286a extends along the first direction D1. In the embodiment, the first direction D1 is the same as the direction X. The position limiting member corresponding to the first limiting hole 286 is fixed at the base 20. The position limiting member passes through and slides in the first limiting hole 286.

The movement of the push member 28 along the first direction D1 is restricted via the first limiting hole 286 and the corresponding position limiting member, which is not limited herein. In other embodiments, other structures are configured to restrict the movement of the push member 28 along the specific direction. When the third push portion 284 of the push member 28 is pushed from the out of the base 10, the push member 28 moves along the first direction D1 relative to the base 10.

Figure 6:
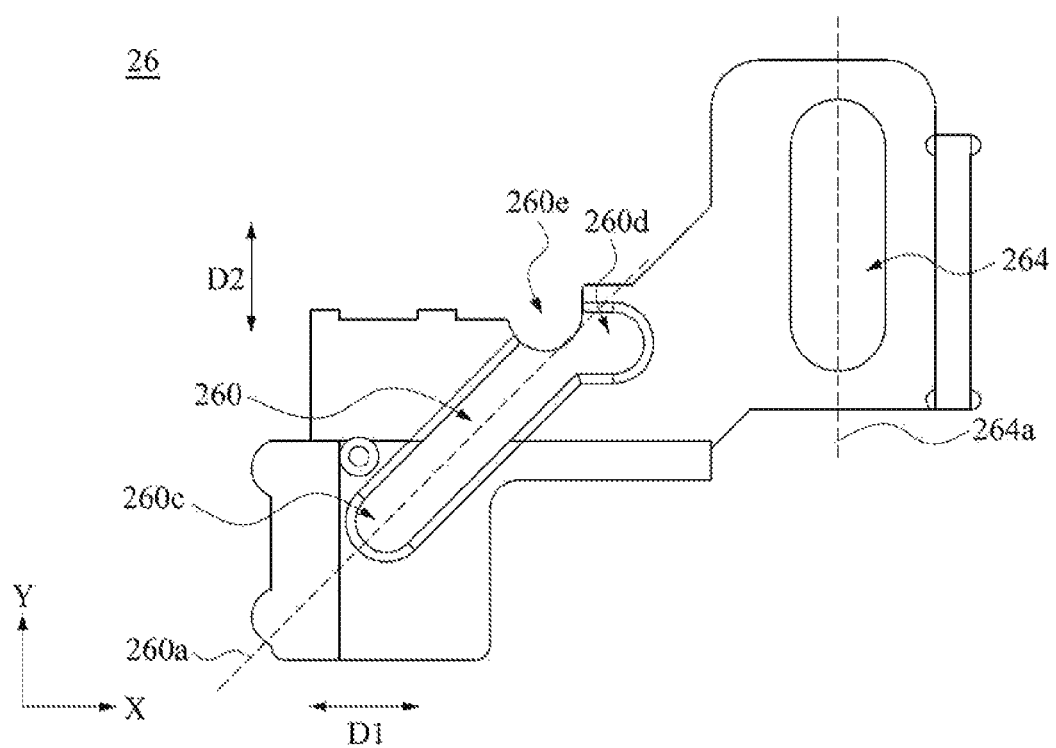
FIG. 6 is a top view of a linkage member of an electronic device in an embodiment.

FIG. 6 is a top view of a linkage member of an electronic device in an embodiment. Please refer to FIG. 5 and FIG. 6. In the embodiment, the linkage member 26 is movably configured in the base 10. The linkage member 26 is below the push member 28. The linkage member 26 includes a sliding slot 260 and a press surface 262. The sliding slot 260 includes a sliding slot center axis 260a, a first end 260c, a second end 260d, and an opening 260e. An acute angle is formed between the sliding slot center axis 260a and the first direction D1. An acute angle is formed between the sliding slot center axis 260a and the second direction D2. In the embodiment, the second direction D2 is the same as the direction Y. The sliding member 280 of the push member 28 is slidably connected with the sliding slot 260 of the linkage member 26. In the embodiment, the push member 28 includes a bearing 282 sleeved on the sliding member 280 to reduce the friction when the sliding member 280 slides in the sliding slot 260. The first normal vector R1 of the press surface 262 of the linkage member 26 faces downwardly as shown in FIG. 5.

In the embodiment, the linkage member 26 is configured to slide along the second direction D2 relative to the base 10. For example, the linkage member 26 includes a second limiting hole 264. In an embodiment, the position limiting member corresponding to the second limiting hole 264 is configured inside the base 20. The second limiting hole 264 includes the second center axis 264a parallel to the max aperture direction. The second center axis 264a extends along the second direction D2. The position limiting member corresponding to the second limiting hole 264 is fixed in the base 20. The position limiting member passes through and is slidable within the second limiting hole 264.

As a result, in the embodiment, the linkage member 26 is restricted the slide along the second direction D2 via the interference between the second limiting hole 264 and the position limiting member, which is not limited herein. In embodiments, other structures are configured to restrict the movement of the linkage member 26 along a specific direction. Consequently, when the push member 28 moves along the first direction D1, the bearing 282 of the push member 28 presses the sliding slot 260 to push the linkage member 26. Then, the linkage member 26 moves along the second direction D2 relative to the base 10.

Please refer to FIG. 5. The moving member 24 is configured in the base 10 and configured on the baseplate 12. The moving member 24 includes a connecting surface 240 corresponding to the press surface 262 of the linkage member 26. The second normal vector R2 of the connecting surface 240 of the moving member 24 faces upwardly from the connecting surface 240 as shown in FIG. 5.

In the embodiment, the moving member 24 is configured to move along the third direction D3 relative to the base 10. For example, the moving member 24 includes a third limiting hole 242. A position limiting member corresponding to the third limiting hole 242 is configured in the base 20. The third limiting hole 242 includes a third center axis 242a which overlaps at the axis center of the third limiting hole 242. The third center axis 242a extends along the third direction D3. In the embodiment, the third direction D3 is the same as the direction Z. The position limiting member corresponding to the third limiting hole 242 is fixed in the base 20. The position limiting member passes through and is slidably connected with the third limiting hole 242.

The movement of the moving member 24 along the third direction D3 is restricted via the third limiting hole 242 and the corresponding position limiting member, which is not limited herein. In other embodiments, other structures are configured to restrict the movement of the moving member 24 along the specific direction. When the linkage member 26 moves along the second direction D2, the press surface 262 of the linkage member 26 presses the connecting surface 240 to push the moving member 24. Then, the moving member 24 moves along the third direction D3 relative to the base 10.

In the embodiment, the first direction D1, the second direction D2, and the third direction D3 are orthogonal to each other, which is not limited herein. The direction can be are various according to requirements in other embodiments.

Figure 7A:
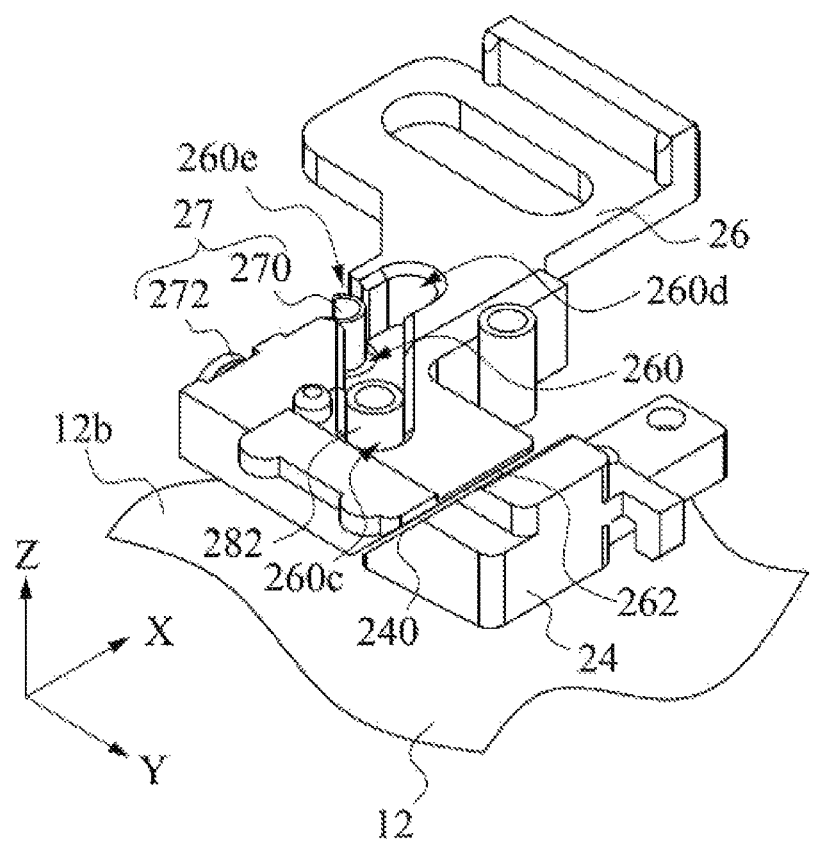
FIG. 7A is a three-dimensional view showing part of an electronic device of which a baseplate covers a bottom surface according to an embodiment.
Figure 7B:
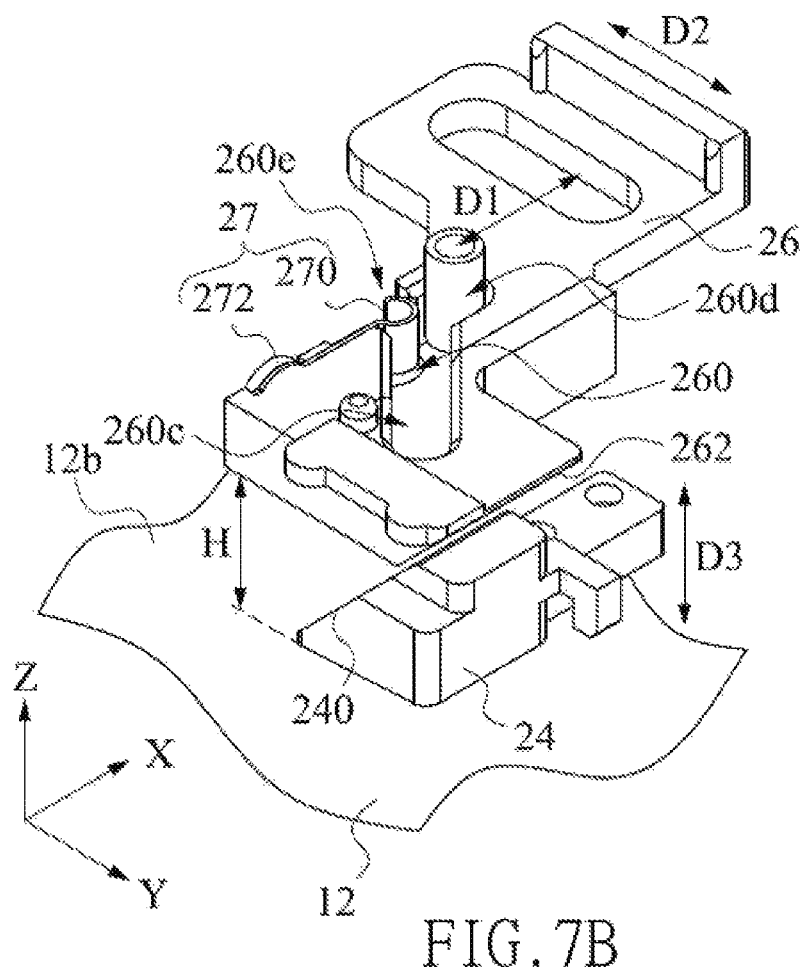
FIG. 7B is a three-dimensional view showing part of an electronic device of which a baseplate is detached from a bottom surface according to an embodiment.

FIG. 7A is a three-dimensional view showing part of an electronic device of which a baseplate covers a bottom surface according to an embodiment. FIG. 7B is a three-dimensional view showing part of an electronic device of which a baseplate is detached from a bottom surface according to an embodiment. In contrast with FIG. 5, in FIG. 7A and FIG. 7B, the base 20 and structures of the push member 28 (except the bearing 282) are not shown for clear figures.

As shown in FIG. 7A and FIG. 7B. When the bearing 282 of the push member 28 is at the first end 260c of the sliding slot 260, the opening (as shown in FIG. 1 and FIG. 2) of the electronic device 2 located at a side of the baseplate 12 which is not pivotally connected with the side edge 12a is closed.

When the push P3 is applied at the third push portion 284 of the push member 28 (as shown in FIG. 5), the push member 28 moves along the first direction D1 relative to the base 10. The bearing 282 of the push member 28 presses the sliding slot 260 to push the linkage member 26. The bearing 282 slides from the first end 260c of the sliding slot 260 to the second end 260d. As a result, the linkage member 26 moves along the second direction D2 relative to the base 10. The press surface 262 of the linkage member 26 presses the connecting surface 240 along the direction of the first normal vector R1 to push the moving member 24. The moving member 24 moves along the third direction D3 relative to the base 10. Since the moving member 24 is configured on the baseplate 12, the baseplate 12 moves away from the base 10 along the third direction D3 relative to the base 10. In an embodiment, a distance H is formed between the surface 12b of the baseplate 12 and the bottom of the linkage member 26. With the configuration, an opening is formed at a side of the baseplate 12 which is not pivotally connected with the side edge 12a. Then, the heat convection between heat components inside the electronic device 2 and the external air is improved.

In an embodiment, the electronic device 1 further includes a block member 27. The block member 27 includes a third protrusion 270 and an elastic arm 272. One end of the elastic arm 272 is connected with the linkage member 26. The other end of the elastic arm 272 is connected with the third protrusion 270. The third protrusion 270 of the block member 27 protrudes from the sliding slot 260 via the opening 260e of the sliding slot 260. The block member 27 is adjacent to the second end 260d of the sliding slot 260. The block member 27 is configured to block the sliding member 280 at the second end 260d.

For example, when the bearing 282 of the push member 28 slides from the first end 260c of the sliding slot 260 to the second end 260d, the bearing 282 is pressed at a side of the third protrusion 270 of the block member 27 inside the sliding slot 260. Consequently, the third protrusion 270 is pressed by the bearing 282 to move out of the sliding slot 260 from the opening 260e. The bearing 282 overcomes the interference of the third protrusion 270 and slides to the other side of the third protrusion 270, as shown in FIG. 7B. When the third protrusion 270 is not pressed by the bearing 282, the third protrusion 270 protrudes in the sliding slot 260 through the opening 260e via the elastic arm 272. As a result, when the bearing 282 slides to the second end 260d, the third protrusion 270 block that the bearing 282 slides near the second end 260d of the sliding slot 260. Consequently, the distance H between the surface 12b of the baseplate 12 and the bottom of the linkage member 26 is kept. That is, the distance between the baseplate 12 and the top surface 100 of the base 10 and the distance between the baseplate 12 and the bottom surface 102 are kept.

Please refer to FIG. 1 and FIG. 2, the electronic device 1 further includes a displacement sensor 19. The displacement sensor 19 is configured on the base 10. The displacement sensor 19 senses the distance between the base 10 and the baseplate 12 to adjust the operation state of a central control system or a heat dissipation device of the electronic device 1. In an embodiment, the central control system is a Central Processing Unit (CPU), and the heat dissipation device is a fan. When the displacement sensor 19 senses that the distance between the base 10 and the baseplate 12 reaches a max value, the base 10 and the baseplate 12 has a max gap therebetween. Since the heat dissipation result is improved due to a big gap, the speed of the CPU is improved, and the temperature would not be too high. In an embodiment, the displacement sensor 19 is an inductive sensor, a capacitive sensor, an optical sensor, a magnetic sensor, or a Hall sensor, which is not limited herein. The position of the displacement sensor 19 is determined according to requirements.

Although the disclosure has been disclosed with reference to certain embodiments thereof, the disclosure is not for limiting the scope. Persons having ordinary skill in the art may make various modifications and changes without departing from the scope of the disclosure. Therefore, the scope of the appended claims should not be limited to the description of the embodiments described above.

What is claimed is:

1. An electronic device, comprising:
    a base including a top surface and a bottom surface;
    a baseplate, a side edge of the baseplate is pivotally connected with the bottom surface,
    a moving member disposed in the base, comprising a press portion, and configured to push against the baseplate;
    a linkage member disposed in the base, comprising a first protrusion, and configured to push against the moving member; and
    a push member disposed in the base and comprising a first push portion, wherein the push member pushes against the linkage member via the first push portion, the linkage member pushes against the press portion via the first protrusion and the push member is configured to make the baseplate move via the linkage member and the moving member in sequence to make the baseplate selectively cover the bottom surface or detached from the bottom surface.

2. The electronic device according to claim 1, wherein the base includes a first pivot portion and a second pivot portion, the first pivot portion is adjacent to the top surface, the second pivot portion is adjacent to the bottom surface, the first pivot portion is pivotally connected with the push member and the linkage member, the linkage member is below the push member, the moving member is pivotally connected with the second pivot portion and below the linkage member.

3. The electronic device according to claim 1, wherein the push member includes a second push portion, the moving member includes a second protrusion, the push member pushes against the second protrusion via the second push portion.

4. The electronic device according to claim 1, wherein the press portion of the moving member further includes a pivot, and the pivot is pivotally connected with the baseplate.

5. The electronic device according to claim 1, wherein the electronic device further includes a hall sensor, and when the baseplate is opened, the hall sensor is driven.

6. An electronic device, comprising:
    a base including a top surface and a bottom surface;
    a baseplate, a side edge of the baseplate is pivotally connected with the bottom surface,
    a moving member disposed in the base, comprising a connecting surface, and configured to push against the baseplate;
    a linkage member disposed in the base, comprising a sliding slot and a press surface, and configured to push against the moving member; and
    a push member disposed in the base and comprising a sliding member, wherein the sliding member is slidably connected with the sliding slot and the push member makes the baseplate moved via the linkage member and the moving member in sequence to make the baseplate selectively cover the bottom surface or detached from the bottom surface.

7. The electronic device according to claim 6, wherein the push member is configured to slide relative to the base along a first direction, the linkage member is configured to move relative to the base along a second direction, and the moving member is configured to move relative to the base along a third direction.

8. The electronic device according to claim 7, wherein the first direction, the second direction, and the third direction are orthogonal to each other.

9. The electronic device according to claim 7, wherein a sliding slot of the linkage member includes a center axis, an acute angle is formed between the center axis and the first direction, and an acute angle is formed between the center axis and the second direction.

10. The electronic device according to claim 6, wherein the sliding slot includes a first end and a second end, when the sliding member is at the first end, the baseplate is closed, when the sliding member is at the second end, the baseplate is opened.

11. The electronic device according to claim 10, wherein the electronic device further includes a block member, the block member includes a protrusion, the protrusion protrudes in the sliding slot, the protrusion is adjacent to the second end, and the protrusion is configured to block the sliding member at the second end.

12. The electronic device according to claim 11, wherein the sliding slot includes an opening, the block member further includes an elastic arm, one end of the elastic arm is connected with the linkage member, the protrusion is connected with the other end of the elastic arm, and the protrusion protrudes in the sliding slot via the opening.

* * * * *